United States Patent
Kim et al.

(10) Patent No.: US 10,274,756 B2
(45) Date of Patent: Apr. 30, 2019

(54) META DEVICE

(71) Applicant: SAMSUNG ELECTRONICS CO., LTD., Suwon-si (KR)

(72) Inventors: Sunil Kim, Osan-si (KR); Changgyun Shin, Anyang-si (KR); Duhyun Lee, Yongin-si (KR); Jungwoo Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/364,796

(22) Filed: Nov. 30, 2016

(65) Prior Publication Data

US 2017/0168324 A1 Jun. 15, 2017

(30) Foreign Application Priority Data

Dec. 9, 2015 (KR) .................. 10-2015-0175345
Aug. 17, 2016 (KR) .................. 10-2016-0104492

(51) Int. Cl.
| | | |
|---|---|---|
| H01L 29/78 | (2006.01) | |
| G02F 1/015 | (2006.01) | |
| G02B 1/00 | (2006.01) | |
| G02F 1/00 | (2006.01) | |
| G02F 1/29 | (2006.01) | |
| H01L 29/24 | (2006.01) | |
| H01L 29/786 | (2006.01) | |
| B82Y 20/00 | (2011.01) | |

(52) U.S. Cl.
CPC ............. G02F 1/015 (2013.01); G02B 1/002 (2013.01); G02F 1/0009 (2013.01); G02F 1/29 (2013.01); H01L 29/24 (2013.01); H01L 29/7869 (2013.01); B82Y 20/00 (2013.01); G02F 2202/30 (2013.01)

(58) Field of Classification Search
CPC ....... H01L 29/24; H01L 29/78; H01L 29/786; H01L 29/7869; G02F 1/0009; G02F 1/015
USPC .......................................................... 257/43
See application file for complete search history.

(56) References Cited

U.S. PATENT DOCUMENTS

| | | | |
|---|---|---|---|
| 6,208,293 | B1 | 3/2001 | Adams et al. |
| 8,311,374 | B2 | 11/2012 | Hochberg et al. |
| 8,674,792 | B2 | 3/2014 | Yonak et al. |
| 8,908,251 | B2 | 12/2014 | Sayyah et al. |
| 9,547,186 | B2 | 1/2017 | Han et al. |
| 2003/0235226 | A1 | 12/2003 | Ueki |

(Continued)

FOREIGN PATENT DOCUMENTS

| | | |
|---|---|---|
| CN | 102707537 A | 10/2012 |
| CN | 102751586 A | 10/2012 |

(Continued)

OTHER PUBLICATIONS

Communication dated Apr. 18, 2017 issued by the European Patent Office in counterpart European Patent Application No. 16200208.3.

Primary Examiner — Monica D Harrison
(74) Attorney, Agent, or Firm — Sughrue Mion, PLLC (57) ABSTRACT

A meta device includes a plurality of meta structures that spaced apart from each other and reflect at least a portion of incident light, a plurality of electrodes that are spaced apart from each other, and a controller configured to control a phase shift of reflected light using a voltage applied to the plurality of electrodes.

29 Claims, 11 Drawing Sheets

(56) References Cited

U.S. PATENT DOCUMENTS

| | | |
|---|---|---|
| 2010/0145666 A1 | 6/2010 | Adachi et al. |
| 2014/0211298 A1 | 7/2014 | Sayyah et al. |
| 2015/0123084 A1* | 5/2015 | Kim .................... H01L 27/326 |
| | | 257/40 |

FOREIGN PATENT DOCUMENTS

| | | |
|---|---|---|
| JP | 2004-23087 A | 1/2004 |
| JP | 5447813 B2 | 3/2014 |
| KR | 10-2012-0077417 A | 7/2012 |

* cited by examiner

META DEVICE

CROSS-REFERENCE TO RELATED APPLICATION

This application claims the priority from Korean Patent Application No. 10-2015-0175345, filed on Dec. 9, 2015, and Korean Patent Application No. 10-2016-0104492, filed on Aug. 17, 2016, in the Korean Intellectual Property Office, the disclosures of which are incorporated herein in their entireties by reference.

BACKGROUND

1. Field

Apparatuses consistent with exemplary embodiments relate to meta devices.

2. Description of the Related Art

A meta material is a material which includes artificial meta structures that are patterned to have sizes and dimensions that are smaller than a wavelength. Each meta structure included in a meta material has particular characteristics in response to electromagnetic waves or sound waves applied to the meta material.

A meta material may be designed and manufactured to have an effective refractive index and an effective material coefficient with respect to electromagnetic waves or sound waves, which do not exist in the natural world. For example, a meta material may enable a new phenomena such as subwavelength focusing, negative refraction, and so forth.

SUMMARY

One or more exemplary embodiments may provide is a meta device including a meta material.

Additional exemplary aspects will be set forth in part in the description which follows and, in part, will be apparent from the description, or may be learned by practice of the presented exemplary embodiments.

According to an aspect of an exemplary embodiment, a meta device includes a plurality of electrodes that are spaced apart from each other, an insulating layer covering the plurality of electrodes, a meta material including a plurality of meta structures spaced apart from each other; and an active layer that is disposed between the insulating layer and the meta material and has a charge density which varies according to an electric signal applied thereto.

Each of the plurality of meta structures may overlap one of the plurality of electrodes.

At least one of the plurality of electrodes may overlap at least two of the plurality of meta structures.

Regions between adjacent ones of the plurality of electrodes may be filled by the insulating layer.

A charge density of a region of the active layer, corresponding to a location of one of the plurality of electrodes, may change upon application of an electrical signal to the one of the plurality of electrodes.

A voltage of a predetermined magnitude may be applied to the active layer, and a voltage of a magnitude that is different from the predetermined magnitude may be applied to the plurality of electrodes.

The active layer may be grounded.

Each of the plurality of electrodes may be electrically isolated from each other of the plurality of electrodes, such that a voltage may be independently applied to each of the plurality of electrodes.

Different voltages may be applied to at least two of the plurality of electrodes.

Different voltages may be applied to two adjacent electrodes of the plurality of electrodes.

A voltage may be applied to the plurality of electrodes such that light reflected from the meta device is steered to a predetermined point.

The predetermined point to which the reflected light is steered may change according to the voltage applied to the plurality of electrodes.

The meta device may further include a circuit substrate configured to apply a voltage to the plurality of electrodes.

The circuit substrate may contact the plurality of electrodes.

A length of each of the plurality of meta structures may be less than an operating wavelength of the meta device.

A size of an interval of a spacing of the plurality of electrodes may be less than a size of an interval of a spacing of the plurality of meta structures.

The active layer may induce a phase shift of reflected light according to a charge density.

The insulating layer may be a first insulating layer, and the meta device may further include a second insulating layer between the active layer and the meta material.

The second insulating layer may include at least one of a metallic compound and a silicon compound.

The second insulating layer may include at least one of $Al_2O_3$, HfO, ZrO, HfSiO, SiOx, SiNx, and SiON.

The active layer may include at least one of indium tin oxide (ITO), indium zinc oxide (IZO), aluminum zinc oxide (AZO), gallium zinc oxide (GZO), and gallium indium zinc oxide (GIZO).

The insulating layer may include at least one of a metallic compound and a silicon compound.

The insulating layer may include at least one of $Al_2O_3$, HfO, ZrO, HfSiO, SiOx, SiNx, and SiON.

The plurality of electrodes may have identical shapes and sizes.

The plurality of electrodes may be arranged one-dimensionally or two-dimensionally.

According to an aspect of another exemplary embodiment, a meta device includes a plurality of meta structures spaced apart from each other and configured to reflect at least a portion of incident light and a controller that includes a plurality of electrodes spaced apart from each other and is configured to control a phase shift of reflected light using a voltage applied to the plurality of electrodes.

The plurality of electrodes may be separated from the plurality of meta structures, and each of the plurality of electrodes may overlap one of the plurality of meta structures.

At least one of the plurality of electrodes may overlap at least two of the plurality of meta structures.

The controller may further include an insulating layer covering the plurality of electrodes and an active layer that is disposed on the insulating layer and has a charge density which varies according to an electric signal applied thereto.

A voltage of a predetermined magnitude may be applied to the active layer, and a voltage of a magnitude that is different from the predetermined magnitude may be applied to the plurality of electrodes.

The insulating layer may be a first insulating layer, and the controller may further include a second insulating layer between the active layer and the plurality of meta structures.

BRIEF DESCRIPTION OF THE DRAWINGS

These and/or other exemplary aspects and advantages will become apparent and more readily appreciated from the following description of exemplary embodiments, taken in conjunction with the accompanying drawings in which.

DETAILED DESCRIPTION

Reference will now be made in detail to exemplary embodiments which are illustrated in the accompanying drawings, wherein like reference numerals refer to like elements throughout. In this regard, the present exemplary embodiments may have different forms and should not be construed as being limited to the descriptions set forth herein. Accordingly, exemplary embodiments are merely described below, by referring to the figures, to explain aspects. Expressions such as "at least one of," when preceding a list of elements, modify the entire list of elements and do not modify the individual elements of the list.

Although the terms used herein are generic terms which are currently widely used and are selected by taking into consideration functions in embodiments, the meanings of the terms may vary depending on the intentions of those of ordinary skill in the art, practices, or the emergence of new technologies. Furthermore, some specific terms may be randomly selected by the applicant, in which case the meanings of the terms may be specifically defined in the description of the exemplary embodiment. Thus, the terms should be defined not by simple appellations thereof but based on the meanings thereof and the context of the description of the exemplary embodiment.

The terms "comprising" or "including" used herein should not be construed as necessarily including all of the elements or steps disclosed herein, and should be construed not to include some of the elements or steps thereof, or should be construed to further include additional elements or steps.

In the following description, an expression such as "above" or "on" may include not only the meaning of "immediately on/under/to the left/to the right in a contact manner", but also the meaning of "on/under/to the left/to the right in a non-contact manner". Hereinafter, the exemplary embodiments will be described in detail only for illustration not limitation while referring to the accompanying drawings.

Figure 1:
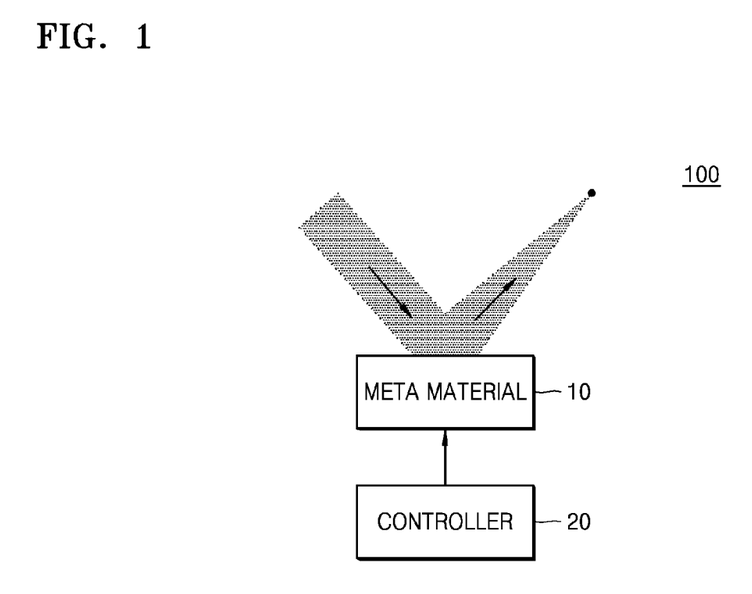
FIG. 1 is a block diagram of a meta device according to an exemplary embodiment.
Figure 2:
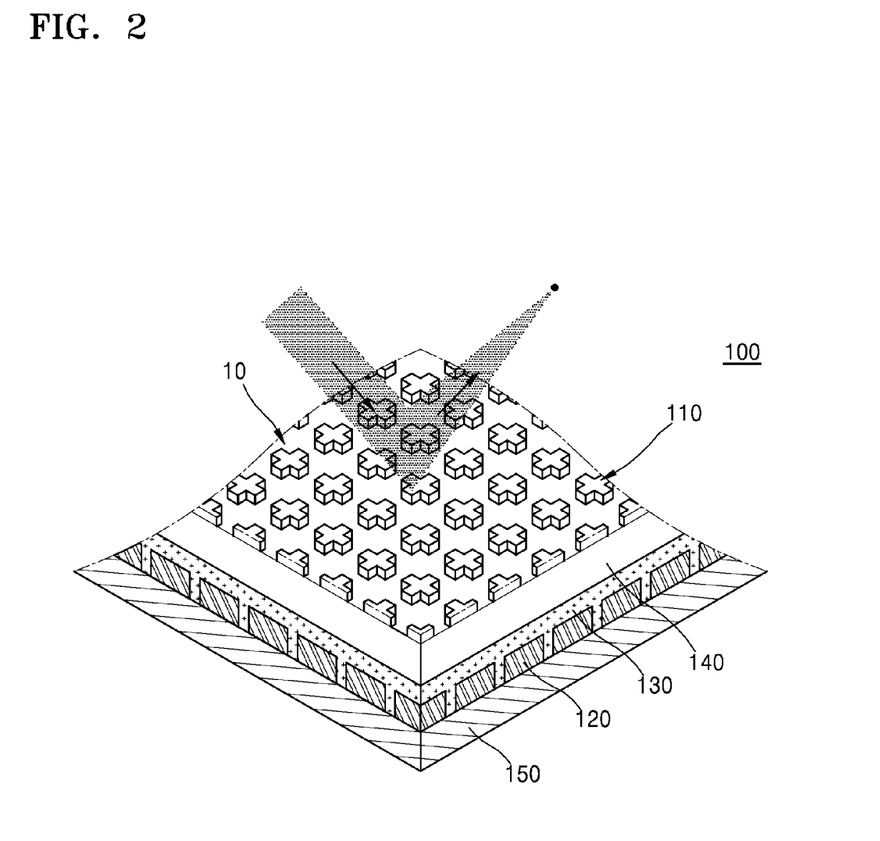
FIG. 2 is a partial perspective view of a schematic structure of the meta device of FIG. 1.
Figure 3:
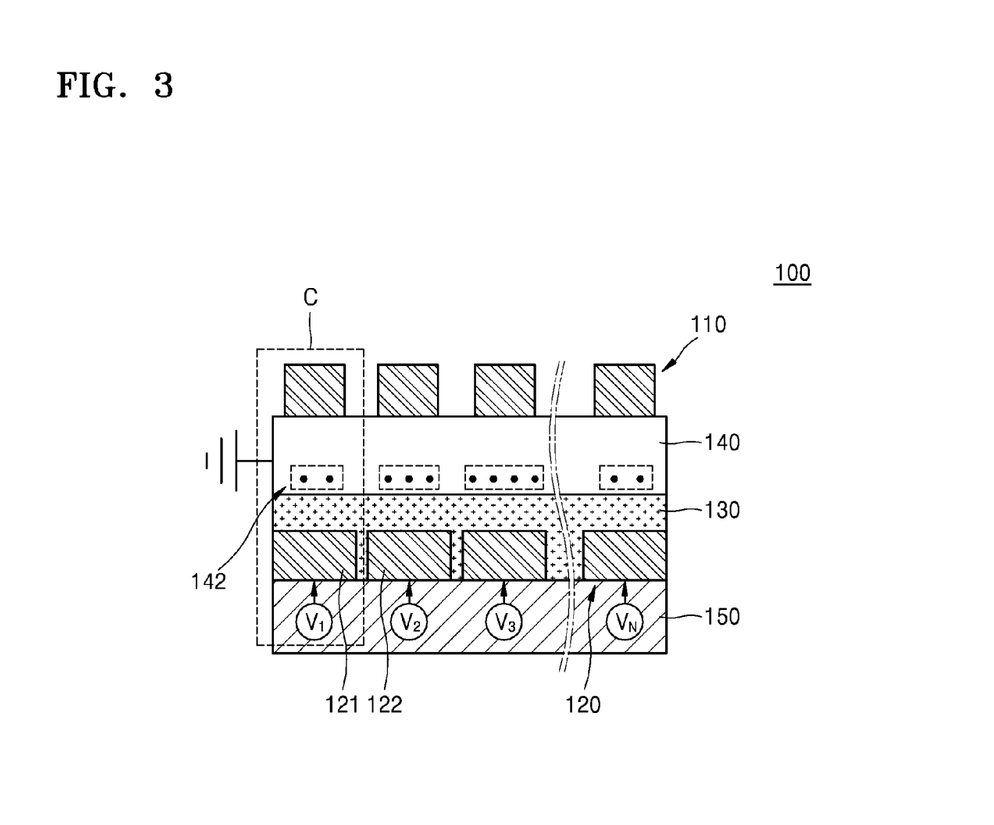
FIG. 3 is a cross-sectional view of the meta device of FIG. 1.

FIG. 1 is a block diagram of a meta device according to an exemplary embodiment, FIG. 2 is a partial perspective view of a schematic structure of the meta device of FIG. 1, and FIG. 3 is a cross-sectional view of the meta device of FIG. 1. Referring to FIGS. 1 through 3, a meta device 100 may include a metal material and a material or layer that is not a meta material. For example, the meta device 100 may include a meta material 10 including a plurality of meta structures 110 that are spaced from each other to reflect incident light; and a controller 20 that includes a plurality of electrodes 120 that are spaced from each other and enable a phase shift of the reflected light based on a voltage applied thereto.

The plurality of meta structures 110 may be arranged in a lattice form. FIG. 2 illustrates that the plurality of meta structures 110 are arranged two-dimensionally. However, an exemplary embodiment is not limited to this illustration. The plurality of meta structures 110 may also be arranged one-dimensionally in a single line.

The meta device 100 may be a patterned material. The meta structure 110 may have a size or a shape that is determined based on a desired operating wavelength. Each meta structure 110 may have a pillar shape, and a cross-section thereof may have any various shapes such as a polygonal shape such as a quadrangular shape, a triangular shape, or the like, a circular shape, an oval shape, a cross shape, and so forth. Although the meta structures 110 of FIG. 2 are shown to have a cross-shaped cross sectional shape, an exemplary embodiment is not limited to this example. A size of the meta structure 110, e.g., a thickness or a length of the meta structure 110, may be less than an operating wavelength. For example, a maximum length of the meta structure 110 may be equal to or less than about ⅓ of the operating wavelength. An interval between the meta structures 110 may be less than the operating wavelength.

Each meta structure 110 has a refractive index with respect to light of the operating wavelength. The meta structures 110 included in the meta device 100 according to an exemplary embodiment reflect at least some of the light incident thereon. The reflected light may be light of the same wavelength as the operating wavelength.

The meta structures 110 may be formed of a conductive material, for example, a metallic material having a high conductivity. The metallic material may include at least one of Cu, Al, Ni, Fe, Co, Zn, Ti, ruthenium (Ru), rhodium (Rh), palladium (Pd), silver (Ag), osmium (Os), iridium (Ir), white gold (Pt), gold (Au), and so forth, or may include an alloy including any one of these materials. The meta structures 110 may be formed of a metallic nano-particular distributed thin film such as Au, Ag, or the like, a carbon nano structure such as a carbon nanotube (CNT), graphene, or the like, and a conductive high polymer such as poly(3,4-ethylenedioxy-thiophene) (PEDOT), polypyrrole (PPy), poly(3-hexylthio-phene) (P3HT), or the like.

The controller 20 controls a phase shift of light reflected from the meta material 10. The controller 20 may include the plurality of electrodes 120 that spaced from each other, a first insulating layer 130 covering the plurality of electrodes 120, and an active layer 140 that is disposed on the first insulating layer 130 and has a charge density which varies according to an electric signal applied thereto. The controller 20 may further include a circuit substrate 150 that applies an electric signal to the plurality of electrodes 120.

The plurality of electrodes 120 are spaced from each other in a one-dimensional array or a two-dimensional array, for example, in a lattice form. Each of the plurality of meta structures 110 may overlap one of the plurality of electrodes 120. For example, the plurality of meta structures 110 may respectively overlap the plurality of electrodes 120 in a one-to-one correspondence. In FIG. 3, the plurality of meta structures 110 respectively overlap the plurality of electrodes 120 in a one-to-one correspondence. However, an exemplary embodiment is not limited to this structure. At least one of the plurality of electrodes 120 may overlap at least two of the plurality of meta structures 110. A capacitor may be formed by the space between the electrode 120 and the meta structure 110 corresponding thereto. The electrode 120, the meta structure 110 corresponding thereto, and a region of the first insulating layer 130 and a region of the active layer 140, which are disposed between the electrode 120 and the corresponding meta structure 110, may form a cell C. The meta device 100 according to an exemplary embodiment shifts a phase of light on a cell by cell basis.

Each of the plurality of electrodes 120 may include a conductive material. For example, each of the plurality of electrodes 120 may include metals such as Cu, Al, Ni, Fe, Co, Zn, Ti, ruthenium (Ru), rhodium (Rh), palladium (Pd), white gold (Pt), silver (Ag), osmium (Os), iridium (Ir), gold (Au), or an alloy thereof, a metallic nano-particular distributed thin film such as Au, Ag, or the like, a carbon nano structure such as a carbon nanotube (CNT), graphene, or the like, and a conductive high polymer such as poly(3,4-ethylenedioxythiophene) (PEDOT), polypyrrole (PPy), poly (3-hexylthiophene) (P3HT), or the like. The plurality of electrodes 120 may include identical materials or different materials.

Each of plurality of electrodes 120 may have a pillar shape, and a cross-section thereof may have any of various shapes such as a polygonal shape like a quadrangular shape, a triangular shape, or the like, a circular shape, an oval shape, and so forth. The plurality of electrodes 120 may have identical shapes or different shapes. A cross-section of the electrode 120 may be larger than that of the meta structure 110. In this case, each electrode 120 may overlap one or more meta structures 110. For purposes of miniaturization of the meta device 100, a thickness of the electrode 120 may be less than the cross-sectional size of the electrode 120, but an exemplary embodiment is not limited to this example. The plurality of electrodes 120 may have identical shapes or different shapes.

An interval between the plurality of electrodes 120 may be equal to or less than an interval between the plurality of meta structures 110. A voltage may be applied to the plurality of electrodes 120. The plurality of electrodes 120 may perform a mirror function for reflecting incident light.

The first insulating layer 130 covers the plurality of electrodes 120 and may extend into the spaces between adjacent ones of the plurality of electrodes 120. The first insulating layer 130 may include a metallic compound such as $Al_2O_3$, HfO, ZrO, HfSiO, or the like. The first insulating layer 130 may include a silicon compound such as SiOx, SiNx, SiON, or the like. Different types of insulating material for the first insulating layer 130 may be used depending on a desired operating wavelength. The portion of the first insulating layer 130 extending between adjacent electrodes may prevent electric shorts among the plurality of electrodes 120. The first insulating layer 130 may have dielectric characteristics such that a change of a charge density of the active layer 140 to be described below may be induced according to an applied electric signal.

The active layer 140 may include a material that has a charge density that varies according to an electric signal (e.g., an electric field) applied thereto and may function as an electrode. The active layer 140 may include, for example, indium tin oxide (ITO) or a ZnO-based oxide such as indium zinc oxide (IZO), aluminum zinc oxide (AZO), gallium zinc oxide (GZO), gallium indium zinc oxide (GIZO), or the like and a transition metallic nitride such as TiN, ZrN, HfN, TaN, or the like.

A voltage may be applied to the active layer 140, and a voltage of a magnitude that is different from that of the voltage applied to the active layer 140 may be applied to the plurality of electrodes 120. For example, the active layer 140 may be grounded and voltages of different magnitudes may be independently applied to the plurality of electrodes 120.

The circuit substrate 150 contacts the plurality of electrodes 120, and may include one or more circuits for applying a voltage, for example, an application specific integrated circuit (ASIC). Thus, the circuit substrate 150 directly applies a voltage to the electrodes 120, simplifying a structure of the controller 20. As described above, The circuit substrate 150 applies different voltages to at least two of the plurality of electrodes 120. For example, the circuit substrate 150 may apply different voltages to two adjacent electrodes among the plurality of electrodes 120.

Referring to FIG. 3, a charge density changes in a region 142 of the active layer 140 corresponding to the position of the electrode 120. The region 142, in which the charge density changes in the active layer 140, may be a region adjacent to the first insulting layer 130 in the active layer 140. Since the charge density of the active layer 140 is changed by the electrode 120, the electrode 120 may be a gate electrode and the electrode 120 is disposed under the active layer 140, such that the meta device 100 may have a bottom gate structure.

As shown in FIG. 3, upon application of a first voltage to a first electrode 121 among the plurality of electrodes 120, a first charge density may be formed in a region of the active layer 140 corresponding to the location of the first electrode 121, and upon application of a second voltage applied to a second electrode 122 among the plurality of electrodes 120, a second charge density may be formed in a region of the active layer 140 corresponding to the location of the second electrode 122. The change of the charge density causes a change of resonance characteristics between the meta structure 110 and the electrode 120, and the changed resonance characteristics cause a phase shift of light reflected from the meta structure 110, such that the phase shift of the reflected light may also change.

Since the circuit substrate 150 independently applies a voltage to the plurality of electrodes 120, the light reflected from the meta material 10 may be steered to a predetermined point. The steering point may vary depending on the voltages applied to the plurality of electrodes 120. For example, by giving proper regularity to a phase shift occurring in an individual cell included in the meta device 100, the light reflected from the meta device 100 may be steered to the predetermined point. Thus, the plurality of electrodes 120 may be arranged two-dimensionally and a range of the steering point may be controlled one-dimensionally or two-dimensionally, such that the meta device 100 may operate as a beam steering device.

Figure 4:
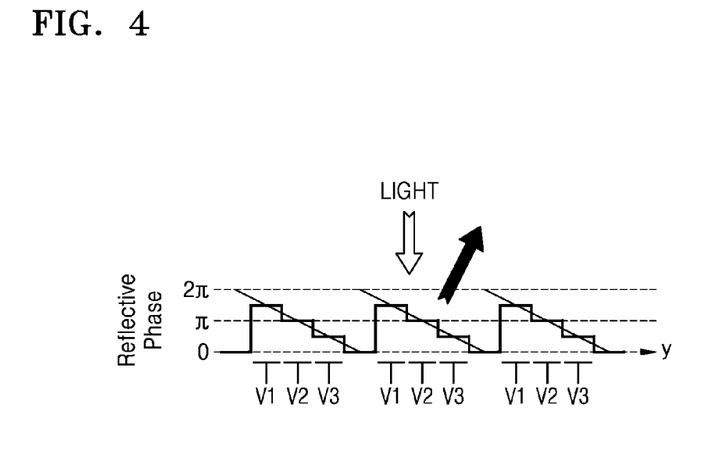
FIG. 4 is a conceptual view illustrating that the meta device of FIG. 3 operates as a beam steering device.

FIG. 4 is a conceptual view illustrating an example in which the meta device 100 of FIG. 3 is capable of operating as a beam steering device. Referring to FIG. 4, in a plurality of cells C, different voltages may be applied to each of the cells C.

When adjacent cells C are controlled in this way, as shown in FIG. 4, to have stepwise phase shift distribution, the reflected light is steered perpendicularly with respect to a straight line connecting phase shift values. This is beam steering in an optical phased array manner, and by adjusting phase shift rules of the optical phased array, the steering direction of the incident light may be adjusted variously.

Although an example has been described above in which the reflected light is steered in one direction, the reflected light may be steered in different directions for different regions, thus accomplishing a beam shaping effect. For example, the meta device 100 may include a plurality of regions, each having a plurality of cells, and a beam may be steered in different directions by the different plurality of regions, thus achieving beam shaping in a desired shape.

Figure 5:
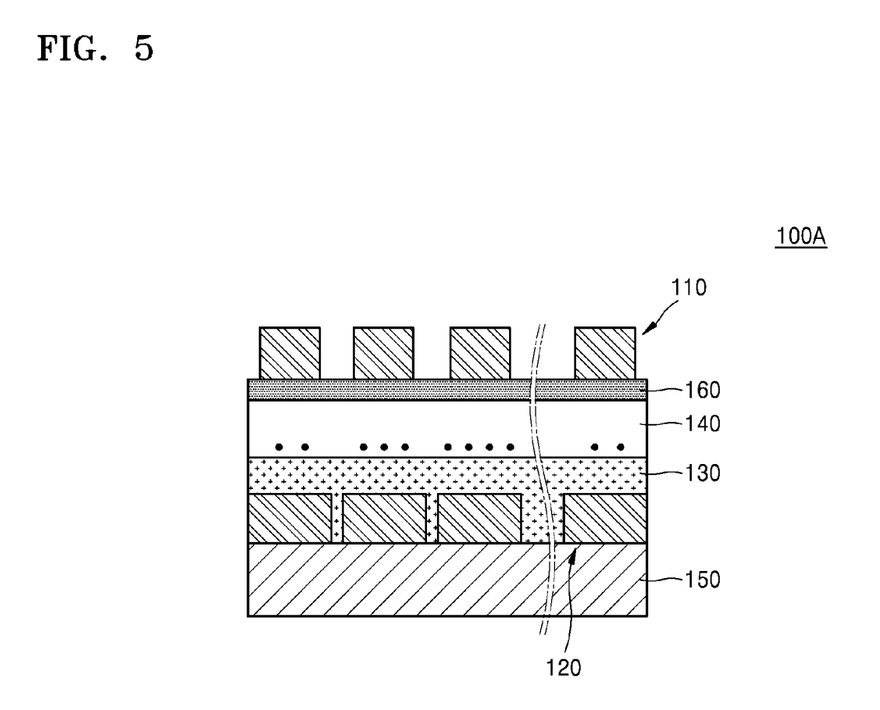
FIG. 5 is a cross-sectional view of a meta device according to another exemplary embodiment.

FIG. 5 is a cross-sectional view of a meta device according to another exemplary embodiment. Comparing FIG. 5 with FIG. 3, the meta device 100A of FIG. 5 may further include a second insulating layer 160 between the meta structure 110 and the active layer 140. Since the active layer 140 functions as an electrode, if the meta structures 110 are disposed in contact with the active layer 140, resonance characteristics may be degraded due to movement of electric charges among the meta structures 110. To prevent the electric charges from moving among the meta structures 110, the meta device 100A of FIG. 5 may further include the second insulating layer 160 between the meta material 10 and the active layer 140.

The second insulating layer 160 may include a metallic compound such as $Al_2O_3$, HfO, ZrO, HfSiO, or the like and a silicon compound such as SiOx, SiNx, SiON, or the like. A type of an insulating material of the second insulating layer 160 may differ depending on a desired operating wavelength.

Figure 6:
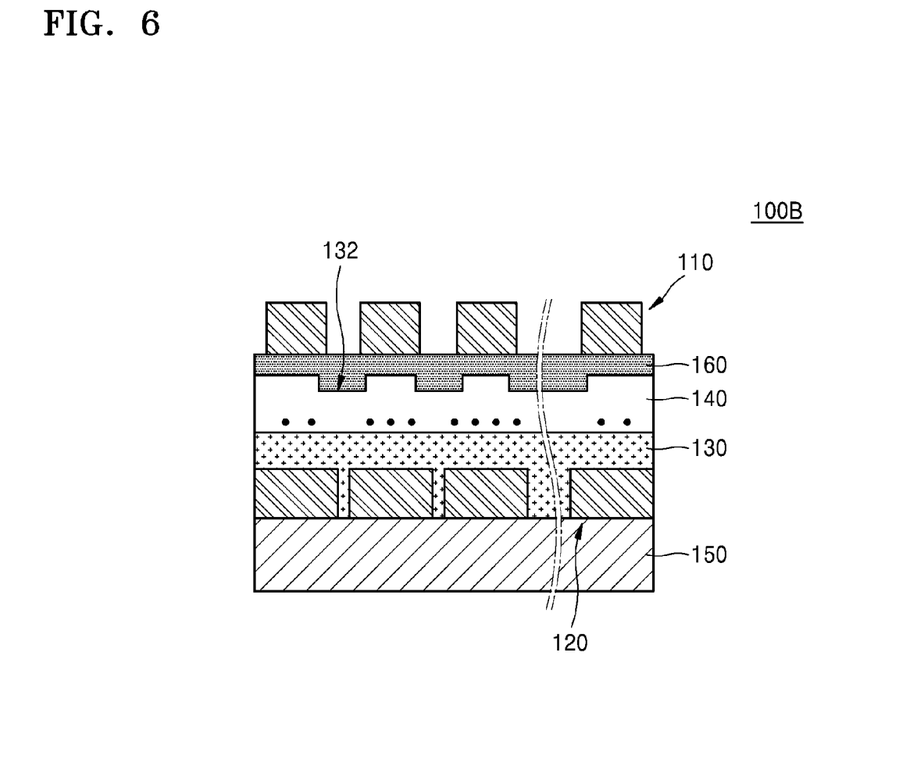
FIG. 6 is a cross-sectional view of a meta device according to another exemplary embodiment.

FIG. 6 is a cross-sectional view of a meta device according to another exemplary embodiment. As shown in FIG. 6, a meta device 100B may include grooves 132 in the active layer 140. The grooves 132 may be in regions of the active layer 140 that correspond to regions between adjacent meta structures 110. The grooves 132 may be filled with the same material as the material of the second insulating layer 160.

Resonance occurs between an electrode 120 and the meta structure 110 corresponding thereto, and resonance may also occur between the electrode 120 and the meta structure 110 adjacent thereto. Thus, the grooves 132 may prevent resonance between electrodes 120 and meta structures 110 adjacent thereto. A length of a groove 132 may be less than an interval between the meta structures 110. However, an exemplary embodiment is not limited to this example. A size of a groove 132 may also be greater than the interval between the meta structures 110.

Figure 7:
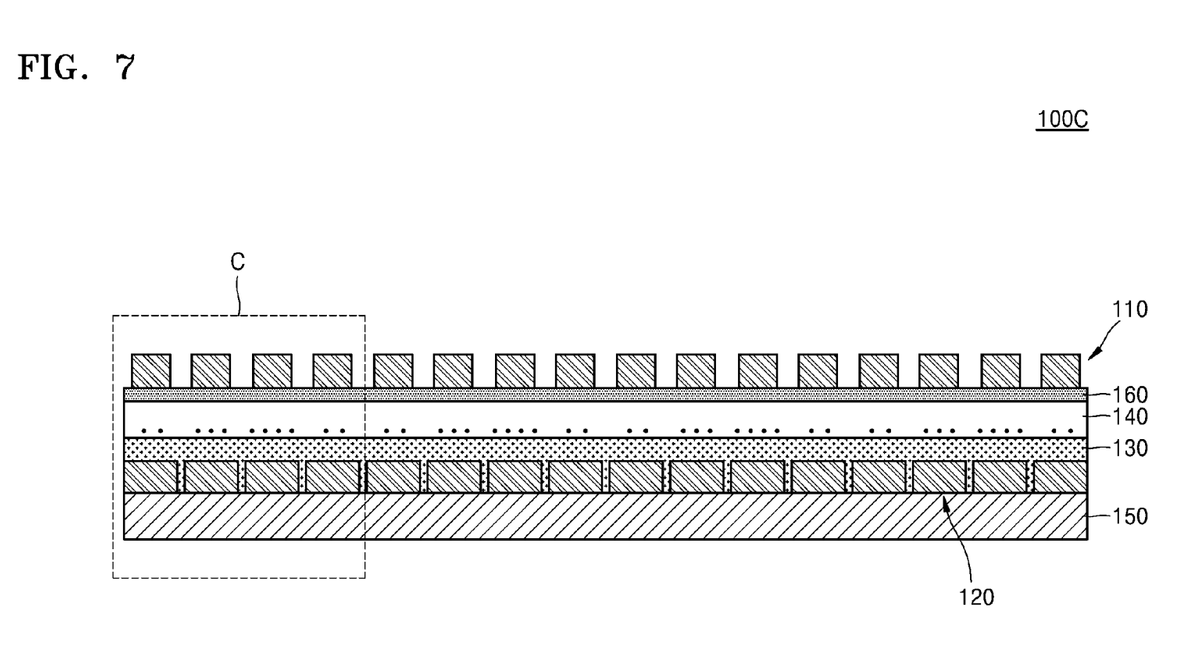
FIG. 7 is a cross-sectional view of a meta device according to another exemplary embodiment.

FIG. 7 is a cross-sectional view of a meta device according to another exemplary embodiment. Comparing FIG. 7 with FIG. 3, in a meta device 100C of FIG. 7, a plurality of meta structures 110 may correspond to one electrode 120. That is, the cell C may include one electrode 120 and the plurality of meta structures 110. The plurality of meta structures 110 included in the cell C may be arranged one-dimensionally or two-dimensionally. Although it is illustrated in FIG. 7 that an electrode physically formed of one layer is one electrode 120, the exemplary embodiment is not limited to this illustration. By applying a voltage of an identical magnitude to a plurality of sub electrodes disposed apart from each other, the plurality of sub electrodes may serve as a single electrode. As such, in the meta device 100, a plurality of meta structures 110 are arranged to correspond to a single electrode 120, thereby steering a greater amount of light.

Figure 8:
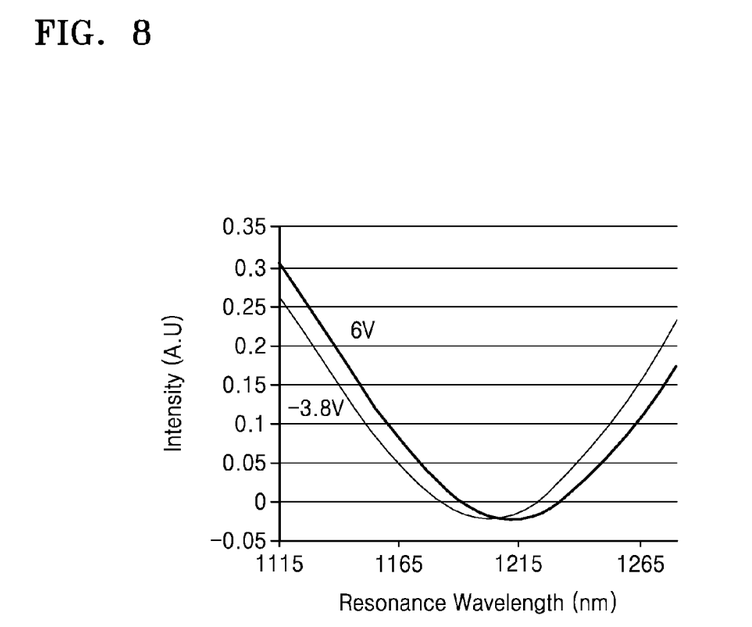
FIG. 8 is a graph illustrating a result of measuring resonance wavelengths with respect to a voltage applied to a cell of the meta device of FIG. 7 according to an exemplary embodiment.
Figure 9:
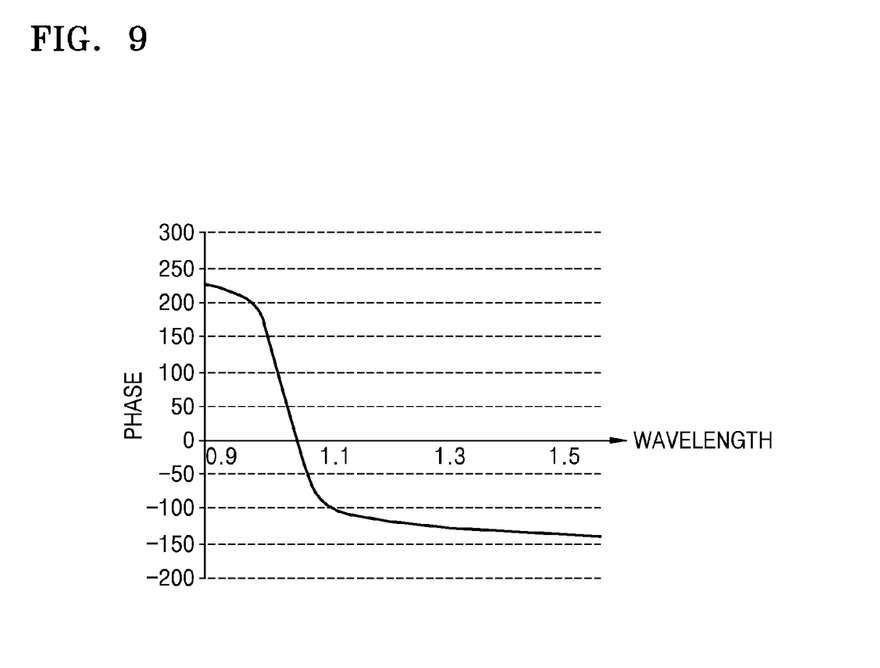
FIG. 9 is a graph illustrating a result of measuring a phase of reflected light with respect to a wavelength of light applied to a cell of the meta device of FIG. 7 according to an exemplary embodiment.

FIG. 8 is a graph illustrating a result of measuring resonance wavelengths with respect to a voltage applied to a cell of the meta device of FIG. 7 according to an exemplary embodiment, and FIG. 9 is a graph illustrating a result of measuring a phase of reflected light with respect to a wavelength of light applied to a cell of the meta device shown in FIG. 7 according to an exemplary embodiment. In this exemplary embodiment, the first insulating layer 130 includes $Al_2O_3$, the second insulating layer 160 includes $SiO_2$, and the active layer 140 includes ITO. The thickness of the first insulating layer 130 may be about 10 nm, the thickness of the second insulating layer 160 may be about 3 nm, and the thickness of the active layer 140 may be about 5 nm. The meta structures 110 and the electrodes 120 include Au, and the horizontal and vertical sizes of the meta structures 20 may be about 200 nm and about 140 nm, respectively. The thickness of the meta structures 20 are about 50 nm, and an interval between the meta structures 20 is about 400 nm. It can be seen from FIG. 8 that as a different voltage is applied to an electrode 120, a resonance wavelength changes. This proves that a phase of reflected light may change according to an applied voltage. It also can be seen from FIG. 7 that a phase of reflected light may change according to a magnitude of a voltage applied to an electrode 120.

Figure 10:
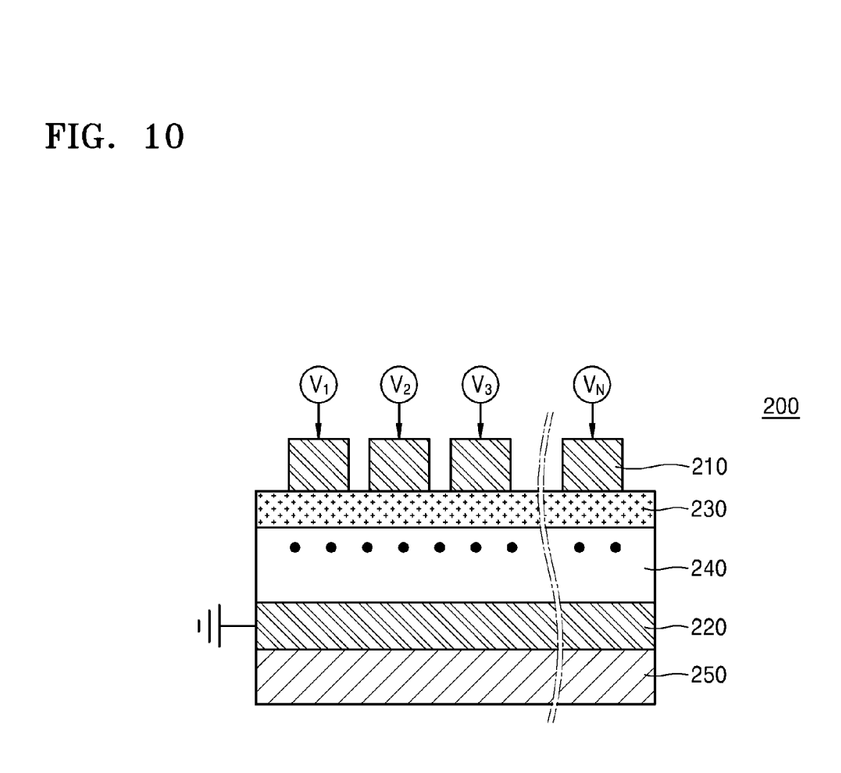
FIG. 10 is a cross-sectional view of a meta device according to a comparative example.

FIG. 10 is a cross-sectional view of a meta device according to a comparative example. A meta device 200 of FIG. 10 may include a substrate 250, an electrode 220, an active layer 240, an insulating layer 230, and meta structures 210, which are disposed sequentially in that order. To change a density of the active layer 240, a voltage is applied to the meta structures 210 and the electrode 220 is grounded. In this case, the meta structures 210 function as gate electrodes and the electrode 220 is disposed on the active layer 240, such that the meta device 200 of FIG. 10 may have a top gate structure.

Using the meta device 200 of FIG. 10, light may be steered. However, to steer the light, different voltages need to be applied to at least two of the meta structures 210 of the meta device 200 of FIG. 10. If the substrate 250 of FIG. 10 is a circuit substrate for applying a voltage, a separate electrode needs to be provided to apply a voltage from the substrate 250 to each of the meta structures 210. However, the processing required for providing separate electrodes is difficult. For example, when a separate electrode is provided by forming a via in the insulating layer 230, the active layer 240, and the electrode 220, processing for the meta device 100 becomes complex and a yield rate is degraded. Thus, the meta device 100 having a bottom gate structure provides easier processing and higher yield rate than those of the meta device 200 having a top gate structure.

By applying the same voltage to the meta structures and using the electrode under the meta structures after separating the electrode to solve the foregoing problem of the top gate structure, processing using a via may be avoided. However, to apply the same voltage to the meta structures, the meta structures need to be connected to each other, and in this case, a beam may not be steered in a direction in which the meta structures are connected, imposing a limitation in two-dimensional beam steering.

Figure 11:
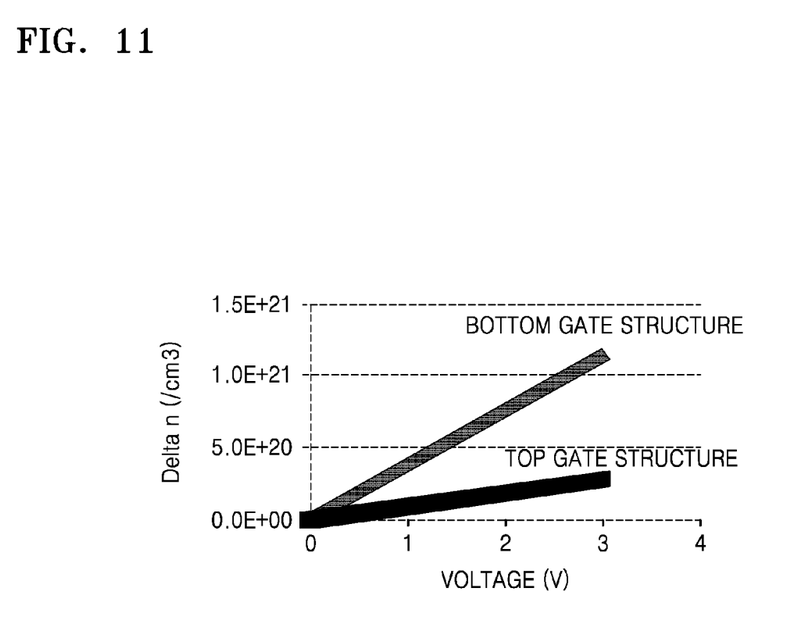
FIG. 11 is a graph illustrating a change of a charge density with respect to a voltage applied to a meta device.

Moreover, a meta device 100 having a bottom gate structure may be superior in performance over a meta device 200 having the top gate structure. FIG. 11 is a graph illustrating a change of a charge density with respect to a voltage applied to a meta device. In FIG. 11, the bottom gate structure indicates the meta device 100 of FIG. 3 and the top gate structure indicates the meta device 200 of FIG. 10. As can be seen from FIG. 11, a charge density in an active layer of the bottom gate structure reacts to an applied voltage more sensitively. Therefore, it is expected that a meta device having the bottom gate structure may control a phase shift of reflected light more easily than with the top gate structure because a change Delta n of the charge density is proportional to a phase shift.

It will be understood by those of ordinary skill in the art that the present disclosure may be implemented in modified forms without departing from essential characteristics of the present disclosure. Therefore, the disclosed exemplary embodiments should be considered in a descriptive sense only and not for purpose of limitation. Thus, the scope of the present disclosure is defined not by the detailed description of the present disclosure but by the appended claims, and all differences within the scope will be construed as being included in the present disclosure.

What is claimed is:

1. A meta device comprising:
a plurality of electrodes that are respectively spaced apart from each other;
an insulating layer covering the plurality of electrodes;
a meta material comprising a plurality of meta structures that are respectively spaced apart from each other; and
an active layer that is disposed between the insulating layer and the meta material and has a charge density which varies according to an electric signal applied thereto;
wherein a dimension of each of the plurality of meta structures is less than an operating wavelength.

2. The meta device of claim 1, wherein each of the plurality of meta structures overlaps one of the plurality of electrodes.

3. The meta device of claim 1, wherein at least one of the plurality of electrodes overlaps at least two of the plurality of meta structures.

4. The meta device of claim 1, wherein regions between adjacent ones of the plurality of electrodes are filled by the insulating layer.

5. The meta device of claim 1, wherein a charge density of a region of the active layer, corresponding to a location of one of the plurality of electrodes, changes upon application of an electrical signal to the one of the plurality of electrodes.

6. The meta device of claim 1, wherein the active layer is grounded.

7. The meta device of claim 1, wherein each of the plurality of electrodes is electrically isolated from each other of the plurality of electrodes.

8. The meta device of claim 1 wherein at least two of the plurality of electrodes are electrically isolated from each other.

9. The meta device of claim 1, wherein two adjacent electrodes, of the plurality of electrodes, are electrically isolated from each other.

10. The meta device of claim 1, wherein a voltage applied to the plurality of electrodes causes light reflected from the meta device to be steered to a predetermined point.

11. The meta device of claim 10, wherein the predetermined point to which the reflected light is steered varies according to the voltage applied to the plurality of electrodes.

12. The meta device of claim 1, further comprising a circuit substrate configured to apply a voltage to the plurality of electrodes.

13. The meta device of claim 12, wherein the circuit substrate contacts the plurality of electrodes.

14. The meta device of claim 1, wherein a size of an interval of a spacing of the plurality of electrodes is less than a size of an interval of a spacing of the plurality of meta structures.

15. The meta device of claim 1, wherein a change in the charge density of the active layer induces a phase shift of light reflected by the meta device.

16. The meta device of claim 1, wherein the insulating layer is a first insulating layer, and the meta device further comprises a second insulating layer between the active layer and the meta material.

17. The meta device of claim 16, wherein the second insulating layer comprises at least one of a metallic compound and a silicon compound.

18. The meta device of claim 16, wherein the second insulating layer comprises at least one of $Al_2O_3$, HfO, ZrO, HfSiO, SiOx, SiNx, and SiON.

19. The meta device of claim 1, wherein the active layer comprises at least one of indium tin oxide (ITO), indium zinc oxide (IZO), aluminum zinc oxide (AZO), gallium zinc oxide (GZO), and gallium indium zinc oxide (GIZO).

20. The meta device of claim 1, wherein the insulating layer comprises at least one of a metallic compound and a silicon compound.

21. The meta device of claim 1, wherein the insulating layer comprises at least one of $Al_2O_3$, HfO, ZrO, HfSiO, SiOx, SiNx, and SiON.

22. The meta device of claim 1, wherein each of the plurality of electrodes has a shape and a size identical to a shape and a size of each other of the plurality of electrodes.

23. The meta device of claim 1, wherein the plurality of electrodes are arranged one-dimensionally or two-dimensionally.

24. A meta device comprising:
a plurality of electrodes that are respectively spaced apart from each other;
an insulating layer covering the plurality of electrodes;
a meta material comprising a plurality of meta structures that are respectively spaced apart from each other; and
an active layer that is disposed between the insulating layer and the meta material and has a charge density which varies according to an electric signal applied thereto,
wherein a length of each of the plurality of meta structures is less than an operating wavelength.

25. A meta device comprising:
a plurality of meta structures that are respectively spaced apart from each other and are configured such that at least a portion of light incident on the plurality of meta structures is reflected therefrom; and
a controller comprising a plurality of electrodes that are respectively spaced apart from each other and are configured to control a phase shift of light reflected from the plurality of meta structures based on a voltage applied to the plurality of electrodes;
wherein a dimension of each of the plurality of meta structures is less than an operating wavelength.

26. The meta device of claim 25, wherein the plurality of electrodes are spaced apart from the plurality of meta structures, and each of the plurality of electrodes overlaps with at least one of the plurality of meta structures.

27. The meta device of claim 26, wherein at least one of the plurality of electrodes overlaps at least two of the plurality of meta structures.

28. The meta device of claim 26, wherein the controller further comprises:
- an insulating layer covering the plurality of electrodes; and
- an active layer that is disposed on the insulating layer and has a charge density which varies according to an electric signal applied thereto.

29. The meta device of claim 28, wherein the insulating layer is a first insulating layer and the controller further comprises a second insulating layer disposed between the active layer and the plurality of meta structures.

* * * * *